United States Patent
Shrinivasan et al.

(10) Patent No.: US 7,327,948 B1
(45) Date of Patent: Feb. 5, 2008

(54) CAST PEDESTAL WITH HEATING ELEMENT AND COAXIAL HEAT EXCHANGER

(75) Inventors: Krishnan Shrinivasan, San Jose, CA (US); Stephen Gentile, Sunnyvale, CA (US); Peter Woytowitz, Mountain View, CA (US); Sassan Roham, San Ramon, CA (US); George Kamian, Scotts Valley, CA (US)

(73) Assignee: Novellus Systems, Inc., San Jose, CA (US)

( * ) Notice: Subject to any disclaimer, the term of this patent is extended or adjusted under 35 U.S.C. 154(b) by 162 days.

(21) Appl. No.: 11/184,101

(22) Filed: Jul. 18, 2005

Related U.S. Application Data

(63) Continuation-in-part of application No. 11/115,576, filed on Apr. 26, 2005.

(51) Int. Cl.
*A21B 2/00* (2006.01)
*C23C 16/00* (2006.01)

(52) U.S. Cl. ................................. 392/416; 118/724

(58) Field of Classification Search ............... 392/416, 392/407, 418, 419; 219/405, 411; 118/725, 118/724; *A21B 2/00; C23C 16/00*
See application file for complete search history.

(56) References Cited

U.S. PATENT DOCUMENTS

| | | | | |
|---|---|---|---|---|
| 3,612,825 A | * | 10/1971 | Chase et al. | 219/405 |
| 5,558,717 A | * | 9/1996 | Zhao et al. | 118/715 |
| 6,307,184 B1 | * | 10/2001 | Womack et al. | 219/390 |
| 6,559,424 B2 | * | 5/2003 | O'Carroll et al. | 219/390 |
| 2004/0183226 A1 | * | 9/2004 | Newell et al. | 264/234 |

OTHER PUBLICATIONS

Bandyopadhyay et al., "Method to Improve Mechanical Strength of Low-K Dielectric Film Using Modulated UV Exposure", U.S. Appl. No. 10/825,888, filed Apr. 16, 2004.

Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.

\* cited by examiner

*Primary Examiner*—Daniel Robinson
(74) *Attorney, Agent, or Firm*—Beyer Weaver LLP.

(57) ABSTRACT

The present invention provides a heat transfer assembly that, when coupled to an object, is capable of keeping the object at a uniform elevated temperature while removing large amounts of heat from an external source. The assembly may be contained in a pedestal for use in a UV-cure chamber. The heat transfer assembly includes a heating element to control the wafer temperature and a cooling element to remove incident IR heat from the wafer and pedestal. A heat resistant layer having a calibrated heat resistance is located between the heating and cooling elements and between the wafer and the cooling elements. The heat resistant layer is able to sustain high temperature gradient from the wafer to the coolant so that the coolant does not boil while permitting enough heat to be conducted away from the wafer to maintain the desired set-point temperature.

22 Claims, 4 Drawing Sheets

CAST PEDESTAL WITH HEATING ELEMENT AND COAXIAL HEAT EXCHANGER

CROSS-REFERENCE TO RELATED APPLICATION

This application is a continuation-in-part of and claims priority to U.S. application Ser. No. 11/115,576, filed Apr. 26, 2005, which is hereby incorporated by reference in its entirety.

BACKGROUND

As integrated circuit (IC) device geometries shrink, development of low-k inter-metal dielectrics (IMDs) becomes more important. Current production processes use dense films that have a dielectric constant (k-value) between 3 and 4. These films are typically deposited using Plasma Enhanced Chemical Vapor Deposition (PECVD) processes and are typically made from either fluoro-silicate glass (FSG) or organo-silicate glass (OSG). Devices in current production have minimum feature sizes that range between 90 nm and 120 nm. The Semiconductor Industry roadmap calls for further shrinking these device geometries to 65 nm, then 45 nm and beyond over the remainder of this decade.

As device geometries shrink further, there is a need for IMD films with k-values under 2.7. Successfully developing a film of such low capacitance requires including porosity in the film. To this end, ultra-low-k (ULK) IMD films of porous OSG have been developed. These ULK films are deposited using PECVD techniques, wherein an OSG backbone and a pore generator (porogen) are co-deposited on a semiconductor wafer. Various techniques such as thermal, ultraviolet (UV) and electron beam curing are then used to drive the porogen out of the composite film leaving behind a porous OSG matrix. The resulting porous film exhibits k-values ranging from 2.0 to 2.5 due to the presence of pores containing air, which by definition has a k of 1.0.

However, the inclusion of pores in these films renders them softer and mechanically weaker than dense OSG films. Mechanical strength and hardness are necessary for the film to survive subsequent processing steps from chemical mechanical polishing to the various wire-bonding steps during chip packaging. Therefore, to compensate for the mechanical weakness introduced by the pores in these ULK films, the OSG backbone needs to be strengthened. Further processing of these wafers using UV radiation and electron beams increases cross-linking, which strengthens the film. Thermal curing has no further effect on the mechanical properties of the film after the porogen has been driven out, and therefore cannot be used to harden or strengthen the film.

Curing with commercially available mercury-vapor UV lamps often results in areas of non-uniformity on the wafer because the tubular geometry of these lamps is not optimized for uniform illumination of a wafer. Further, there are significant variations in UV output from lamp to lamp. Non-uniformity in pedestal and wafer temperature could cause non-uniformity in curing, and consequently in the properties of the porous ULK film.

Mercury-vapor lamps exhibit another significant shortcoming, namely that in order to generate said vapor, the lamps must operate at significantly higher temperatures than is desired for processing ULK films. To accelerate curing as much as possible, it is desirable that the wafer be processed as close to the maximum temperature limit (usually around 400° C.) as possible. Typical commercial lamp systems cause the lamp envelope to reach temperatures between 800° and 900° C. The IR radiation emitted by the lamp envelope is incident on the wafer in much the same way as the UV emanating from the lamp discharge. This will cause the wafer temperature to increase above the preferred set-point if active cooling is not performed. Moreover, wafer temperature non-uniformity due to lamp heating (typically 30° C. range) is far worse than that due to pedestal heating (as low as 3° C. range).

Therefore, there is a, need for inventions that improve the uniformity of curing and wafer throughput by heating the semiconductor wafer to its operating temperature (e.g., 400° C.), while removing the IR heat flux incident on the wafers from the lamps. It would also be desirable to remove heat from the pedestal using commonly available facility cooling water.

SUMMARY OF THE INVENTION

The present invention addresses these needs by providing a heat transfer assembly that, when coupled to an object, is capable of keeping the object at a uniform elevated temperature while removing large amounts of heat from an external source. Additionally, commonly available semiconductor fabrication facility water may be used as the only coolant. The assembly may be contained in a pedestal for use in a UV-cure chamber. The heat transfer assembly includes a heating element to control the wafer temperature and a cooling element to remove incident IR heat from the wafer and pedestal. A heat resistant layer having a calibrated heat resistance is located between the heating and cooling elements and between the wafer and the cooling elements. The heat resistant layer is able to sustain high temperature gradient from the wafer to the coolant so that the coolant does not boil while permitting enough heat to be conducted away from the wafer to maintain the desired set-point temperature. In some embodiments the heat transfer assembly includes coaxial tubes with coolant flowing through the inner tube and resistance materials in the annular gap between the tubes. The resistance materials may include a spiral coil and/or insulating material such as sand. In some embodiments, a compressed gas is included. The heat resistance may be calibrated by varying the pitch of the spiral coil, the annular gap distance, the materials in the layer and/or gas composition and pressure.

DETAILED DESCRIPTION OF THE PREFERRED EMBODIMENTS

Introduction

Figure 1:
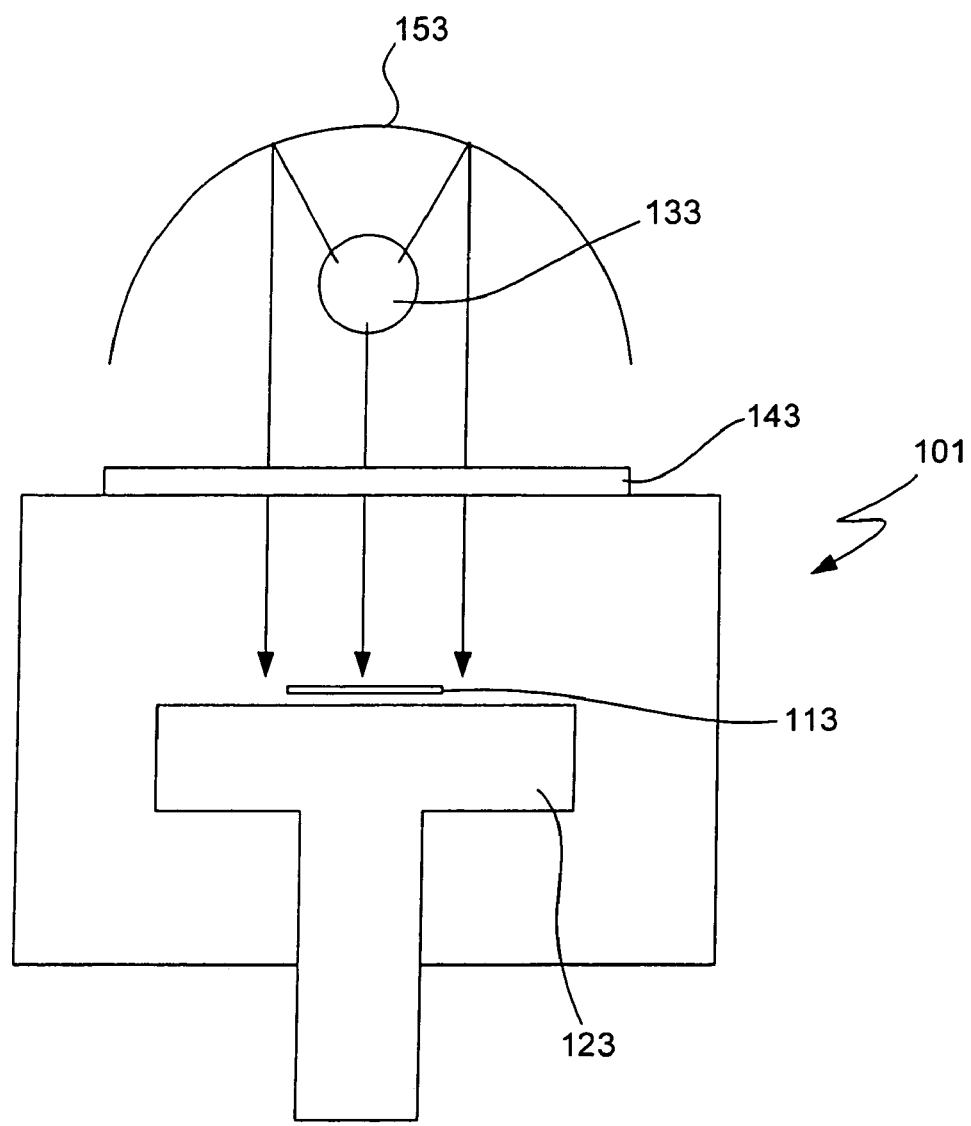
FIG. 1 is a schematic illustration showing a UV cure chamber.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention. While the use of ultraviolet (UV) radiation has been employed for purposes of illustrating the present invention, other forms of radiation (i.e., from other parts of the electromagnetic spectrum) can also be practiced using the same essential elements described herein.

In addition, while the heat transfer assemblies of the present invention are described in the context of curing, the invention is not so limited. For example, the pedestals may be used in any IC fabrication process in which it is necessary to maintain a wafer at a uniform temperature while removing heat from an external heat source, such as lamps or a plasma discharge. Further, the heat transfer assemblies of the present invention are not limited to use in pedestals or IC fabrication processes, but may be used in any application where it is necessary to remove large amount of heat from an external source while maintaining an object at a uniform specified temperature. For example this inventions can be used to maintain temperature of chamber walls for semiconductor or other processes, particularly when they may need to be maintained at elevated temperatures (i.e., for purposes of this description, above the normal boiling point of a commonly available coolant) while additional energy is incident on the same walls from higher temperature sources such lamps or a plasma discharge The heat transfer assemblies described herein are also particularly useful in applications where heat flux from the external sources is not uniform and also when uniform temperature control is desired.

UV treatment of semiconductor wafers has many applications including removing porogens, strengthening porous OSG backbones, improving dense non-porous OSG film properties, curing nitrides and other dielectric layers, densification of dielectric materials, and increasing stress in dielectric films (for, e.g., strained gates).

As discussed above, UV curing is sometimes used to drive out porogen from composite porogen-OSG films, leaving a porous OSG matrix with a low k-value, generally between 2.0 and 2.5. UV curing may also be employed to lower the k-value of other dielectric materials such as oxides deposited by pulse deposition layer (PDL) processes. PDL processes (also known as rapid vapor deposition or RVD processes) are described in U.S. Pat. No. 6,867,152, hereby incorporated by reference in it entirety.

In addition to driving out porogens, the curing or treatment process increases cross-linking of the bonds in the OSG matrix, results that are beneficial to the resulting electronic devices. Side effects of this cross-linking may include increased stress and strain of the materials, and densification the material. Thus, in addition to porogen removal, UV curing or treatment may also be used for applications where increased stress, cross-linking, and/or density is desired. UV curing substantially increases the cross-linking of the OSG films, which strengthens the films, and has been used to strengthen porous and non-porous films. Both dense and porous low-k films show significant improvement in both mechanical and electrical properties after UV curing. UV curing may be also useful for increasing density of other dielectric films, such as ashable hard masks. In addition, UV curing is employed in applications for which high tensile stress is desirable. For example, for films at the transistor level, UV curing is used to produce silicon nitride film with high tensile stress. The high stresses in the films modulate strained silicon, enabling higher device speeds with minimal process cost.

In certain embodiments, the curing process for semiconductor wafers takes place in a chamber filled with a gas. FIG. 1 shows cure station 101. Wafer 113 is located on or above a wafer pedestal 123. In some embodiments a chuck may be used to hold the wafer in place during the curing process. The wafer does not necessarily directly contact the chuck and/or pedestal. For example, the wafer may be floated above the wafer support on pins for example. UV radiation from UV light source 133 passes through window 143 to reach wafer 113. Some of the light is incident on the wafer after being reflected from reflector 153. Wafer 113 is then exposed to the radiation. Common types of UV lamps typically operate at temperatures of above 600° C., i.e., the quartz envelopes of thee lamps are maintained at these temperature to maximize UV output. The resulting IR radiation from the lamps is also incident on the wafer. The cure station shown in FIG. 1 is an example of a single-station cure chamber. Multi-station cure chambers for sequential processing are described in U.S. application Ser. No. 11/115, 576, filed Apr. 26, 2005 and may be used. As discussed above, the geometry of commonly available UV radiation sources results in non-uniform irradiation of the wafer surface, thereby causing variations in the cure efficacy at various locations. Further, reflector systems (such as those discussed in U.S. application Ser. No. 11/115,576)), are optimized for UV uniformity and not IR uniformity. Thus, even where uniform UV irradiation is achieved, the wafer may be exposed to non-uniform IR heat.

Curing processes such as those described above are very sensitive to wafer temperature. Therefore, it is vital that wafer temperature be controlled uniformly and repeatably. Moreover, the wafer is itself assigned a very strict thermal budget, i.e., its temperature during process should not exceed a certain value. For e.g., when curing porous low-k dielectric films, the wafer temperature should not exceed 400° C. so as to not damage the underlying copper layers. As noted above, the presence of non-uniform IR radiation from the UV lamps creates two issues:

1. Since the lamps are at a higher temperature than is commonly desired for the wafer during curing, IR radiation incident on the wafer from these lamps will result in over-heating. Therefore, the excess IR flux from the lamps will need to be removed from the wafer so as to maintain it at a desired temperature.

2. Since, IR flux from the lamps is non-uniform, the wafer temperature will also be non-uniform. To compensate for this it is essential that the wafer be thermally coupled to a uniform source of heat. In semiconductor processing, heated metal pedestals offer the best method for providing uniform wafer temperature. To take advantage of this temperature uniformity, it is best to operate at high chamber pressures (>50 Torr) so that the higher gas thermal conductivity offered at these pressures provides for efficient thermal coupling between wafer and pedestal. As a consequence of this, the pedestal itself must be capable of operating at approximately the same temperature as that desired for the wafer during curing. Typically, for a 400° C. wafer temperature, the pedestal is set to operate at 380° C. to 390° C., the difference representing the temperature gradient induced by heat removed from the wafer to the pedestal.

The pedestals of the present invention successfully addresses these issues by being capable of operating at a high temperature, while retaining the ability to extract excess heat from the wafer. In a typical embodiment, the pedestal is capable of removing up to 4 kW of heat from a wafer, while operating at up to 450° C. for a typical cure process. To facilitate these specifications, the pedestals according to preferred embodiments have: 1) the means to elevate their temperatures to 450° C. and 2) the means to remove excess heat incident on the wafer and pedestal without causing a dip in temperature.

Commonly available coolants such as water and ethylene glycol (the main ingredient in automotive anti-freeze) boil at very low temperatures. Therefore, if they come in contact with the hot walls of a coolant channel in a pedestal maintained at 450° C. these coolants will boil. Since boiling heat transfer is a very efficient means of removing heat, the result will be that the pedestal temperature will dip below the desired set-point of 450° C. Indeed, it is impossible to operate a pedestal at more than 200° C. with a low-boiling coolant such as water or ethylene glycol.

To remove heat from high temperature pedestals, high-boiling fluids have also been used as coolants. These coolants are not commonly available in semiconductor or other manufacturing facilities and thus a dedicated coolant delivery system must be provided. To prevent progressively increasing coolant temperatures, the excess heat removed from the pedestal must be extracted from the coolant, thus requiring external heat exchangers to cool the fluid down before re-introducing it to the pedestal. These systems are undesirable because of this complexity and also because it is difficult to pump high temperature fluids. Gas flown over the pedestal has also been used as a heat transfer fluid; however, this method is inefficient. These type of high-boiling fluids and their associated equipment reduce the reliability and safety and increase the cost of the system, thus, are very undesirable compared with the approach used in the present invention.

Independent Control of Workpiece Temperature and External Source Heat

The present invention provides independent control of the workpiece temperature regardless of the heat flux from an external lamp source. By using the wafer pedestal of this invention in UV curing applications, the wafer temperature is decoupled from the UV intensity emanating from the lamps. Typically, curing chambers use broad-band high-intensity sources, such as mercury-vapor lamps. Commercially available medium pressure mercury vapor lamps emit radiation of wavelength from below 200 nm to the far-IR range. The wafer is exposed to visible, UV and IR radiation. In typical dielectric curing applications, the visible and IR radiation causes wafer heating. In such lamp systems, intensity of radiation output is adjusted through modulation of electrical power that is fed to the lamps. This may occur either directly through adjustment of electrical voltage in arc-discharge lamps or by modulation of microwave power in those systems that use microwave plasma discharge. In either case, an increase in desirable UV output is accompanied by a corresponding increase in undesirable IR and visible energy output. Thus, the wafer temperature can become closely coupled to the UV intensity in conventional chambers. In addition, because the lamps typically do not illuminate the surface of the wafer uniformly, wafer temperature can be highly non-uniform across the surface of the wafer.

It is desirable to control the wafer temperature and provide high UV intensity without requiring sophisticated filtering systems to remove the IR radiation. Decoupling wafer temperature and UV intensity has benefits in addition to eliminating the harmful effects of non-uniform heat incident on the wafer. The ability to control wafer temperature independently of the UV intensity (and vice versa) allows for modulating certain side-effects of the curing process in preference to one another. The curing process has several side effects that may be beneficial to the various dielectric materials employed in an integrated circuit. As mentioned above, side effects of curing include increased stress and strain of the materials, increased cross-linking of the bonds of the material and densification the material. It is often desirable to increase one of these effects relative to the others for a particular application. For example, for dense low-k carbon-doped oxide films, it is desirable to increase the mechanical properties of the films by cross-linking without a large increase in the stress of the film. For silicon nitride films, a large increase in the stress is desirable. Any of these effects can be modulated in preference to the others by decoupling control of the wafer temperature from UV intensity. In other words, each combination of effect and side-effect requires its own optimal combination of temperature and V flux.

Heat Transfer Assembly

The present invention provides heat transfer assemblies and pedestals that are capable of modulating these effects by providing independent control of the wafer temperature and the UV intensity. The pedestals of this invention are equipped with a combination of heating elements and cooling elements to control their temperature. The wafer temperature is decoupled from the light source (by providing a cooling elements to remove the IR heat) and coupled to a uniform and easily controlled source, i.e. the heating elements. Wafer temperatures may be maintained at levels as high as that which can be tolerated by materials used in the construction of integrated circuits, or assigned to the wafer as part of an overall thermal budget. Preferred wafer temperatures range from 200° C. to 600° C. More preferred temperatures range from 250° C. to 450° C.

The heat transfer assemblies and pedestals of the present invention are capable of maintaining the wafer (or other workpiece) at an elevated uniform temperature, i.e. within 2° C. of a set-point temperature. The heat transfer assemblies of the present invention also provide consistent temperatures from pedestal to pedestal.

Figure 2A:
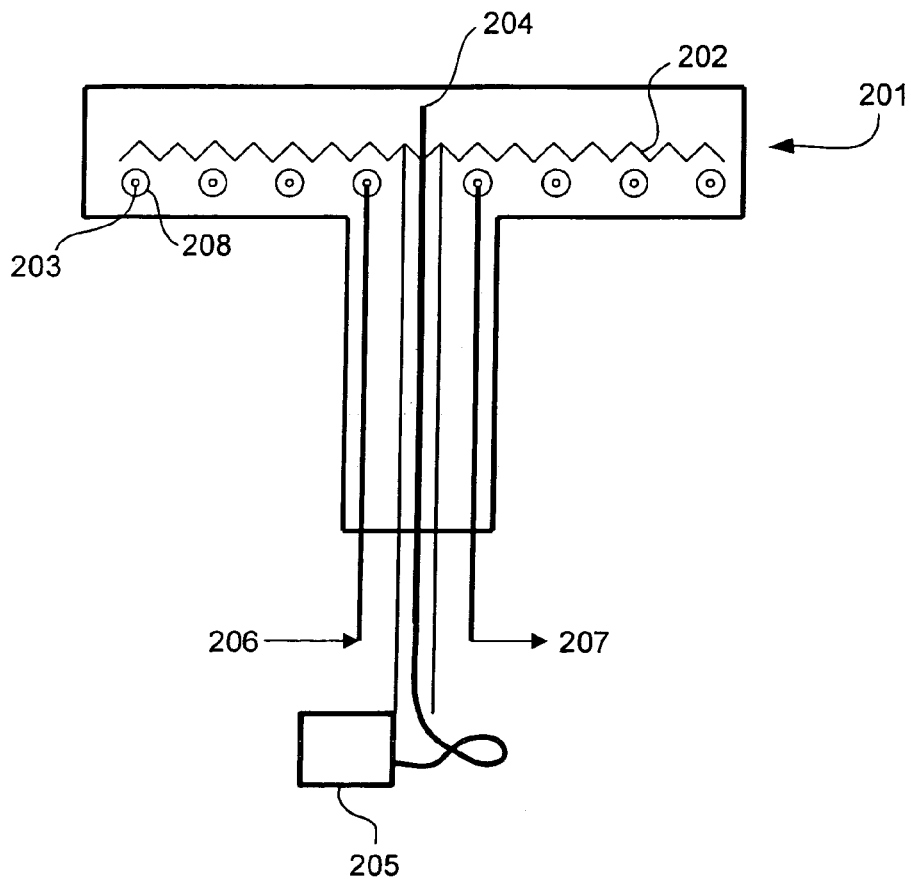
FIG. 2a is a schematic illustration showing a cross-section of a pedestal and heat transfer assembly according to one embodiment of the present invention.

FIG. 2a shows a cross-section of a pedestal containing a heat transfer assembly according to one embodiment of the invention. Pedestal 201 contains heater coils 202 and cooling channel 203. The heating elements or coils of this invention are controlled using a feedback loop. In the embodiment shown in FIG. 2a, thermocouple 204 is embedded in pedestal 201. Preferably the thermocouple is located close to the top surface on which a wafer rests for processing. Temperature readings from thermocouple 204 are fed to a closed-loop temperature controller 205, which adjusts electrical power fed to the heater so that the set-point temperature is maintained. The temperature controller automatically reduces power to the heater coils when heat from the external source is incident on the wafer so that the uniform temperature is maintained. Standard closed loop temperature control systems well known in the art may be used.

Figure 2B:
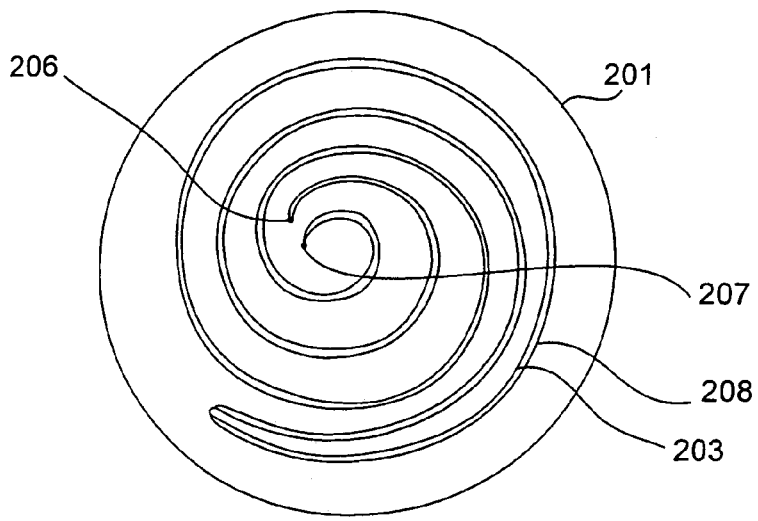
FIG. 2b is a schematic illustration showing a top view of cooling channels in a pedestal according to one embodiment of the present invention.

Cooling channel 203 is a tube arranged in a continuous spiral as shown in top view of the pedestal 201 as shown in FIG. 2b. Cooling water enters cooling channel 203 at inlet 206 and exits at outlet 207 after traveling the length of the channel. The cooling channel tube is surrounded by a layer 208. Layer 208 has a heat resistance calibrated so that heat from the external heat source may be removed by the water in cooling channel 203 while preventing the water from boiling. If the resistance of layer 208 is too high, not enough heat will be removed and the wafer temperature will rise above the set-point. This can damage or destroy the films already present on the wafer or lead to undesirable film characteristics. If the resistance of layer 208 is too low, too much heat will be removed. This will lead to water in cooling channel 203 to reach boiling temperature. Boiling will cause over-cooling due to the latent heat of the evaporation. In addition, boiling is undesirable as it requires steam to be vented and prevents water from being returned to the facility. Overcooling of the wafer can also occur without boiling of the fluid. Overcooling of the wafer is undesirable from the process description previously described (see preferred and most preferred temperatures).

Figure 2C:
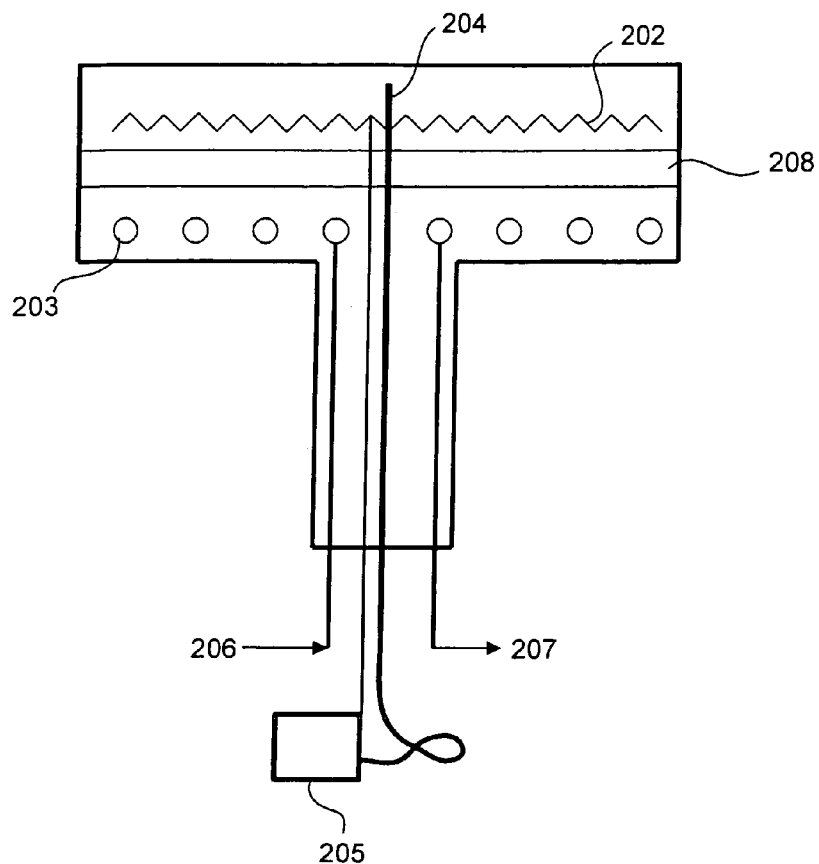
FIG. 2c is a schematic illustration showing a cross-section of a pedestal and heat transfer assembly according to one embodiment of the present invention.

In preferred embodiments, the heat resistant layer is located between the heating elements and the cooling channel. Thus, the heat resistant layer in FIG. 2a comprises material enclosed by an outer tube that surrounds and is coaxial with the cooling channel. FIG. 2c shows an alternate embodiment. As with the embodiment shown in FIG. 2a, temperature controller 205 is connected to heating coils 202 and water flows through cooling channel 203. However in this embodiment cooling channel 203 is located below heat resistant layer 208. Heater coils 202 are located above layer 208.

In preferred embodiments, the heating and cooling elements are cast into the pedestal. Casting a liquid metal around the heating and cooling elements (and the heat resistant layer for the tube-in-tube exchanger shown in FIG. 2a) is controllable to a high degree. Thus, it is possible to get a consistent interface between the heating elements and the coaxial tubes or other cooling elements and the pedestal metal. In preferred embodiments, only one casting is required to embed the heating elements, cooling elements and heat resistant layer in the pedestal.

Heating Elements

Heating elements are used to control the workpiece or object temperature. Thus, in a UV cure chamber the wafer temperature is controlled by the heating elements. Standard resistive electrical heaters used to heat pedestals in CVD chambers that are well-known to one skilled in the art may be used. In preferred embodiments, electrical heating coils in a metal sheath with a high melting point are used. The pedestal may be made by casting aluminum over the heating elements (as well as the cooling channels and resistant layer), so the heating coil should be made of metal that has a higher melting point than aluminum. Examples of such metals include stainless steel, nickel, and high-nickel alloys such as Inconel and Hastelloy As discussed above, the workpiece temperature is elevated. According to various embodiments the elevated temperature may be from 200° C. to 600° C. In preferred embodiments wherein the workpiece is a wafer in IC fabrication process, the elevated temperature may be from 200° C. to 600° C., more preferably from 250° C. to 450° C. In a particularly preferred embodiment, the elevated temperature of a wafer in is around 400° C.

For IC fabrication processes, the wafer should be closely coupled to the pedestal so that the pedestal controls the wafer temperature. Thermal coupling of the wafer and pedestal is described in U.S. application Ser. No. 11/115,576, referred to above. Briefly, the type of gas used and its pressure are important for providing efficient coupling between wafer and pedestal. A gas with high thermal conductivity (e.g., helium) is preferred to provide for efficient thermal coupling between the wafer and the pedestal or other support to the wafer. Helium gas at the desired pressure may be provided either by filling the process chamber, or by providing for wafer back-side pressure control using helium. In the latter case, the chamber pressure must be controlled at a higher value that that at the wafer back-side, albeit with a more commonly available gas such as nitrogen. By providing helium to just the wafer back-side its usage is curtailed. Heat transfer between the wafer and the pedestal takes place by conduction through the gas in the small physical gap between the two. The support can thus be used to control the temperature of the wafer. Operating at high pressure is preferred so that higher gas conductivity can provide good thermal coupling between the wafer and the pedestal. A preferred range is 10-600 Torr. An even more preferred range is 200-600 Torr. At a typical operating temperature of 400° C., the pedestal is typically 15° C. cooler than the wafer over a wide range of UV lamp power settings and output intensities. Thus, throughout the application, pedestal temperature may be referred to instead of wafer temperature as the two are closely coupled.

Figure 2D:
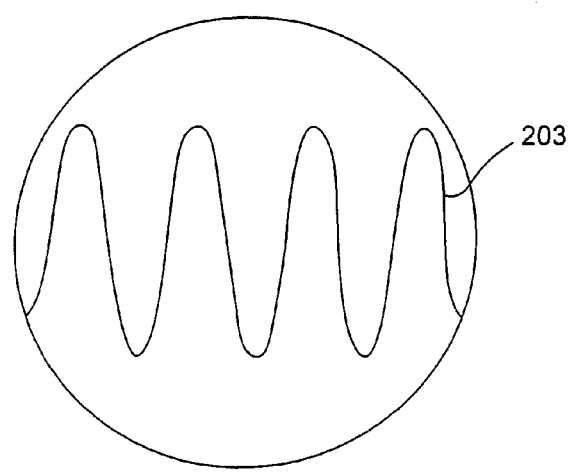
FIG. 2d is a schematic illustration showing a top view of cooling channels in a pedestal according an alternate embodiment of the present invention.

In preferred embodiments, the heating elements are active and the cooling elements are passive so that pedestal temperature is controlled only by adjusting the heating element power. This is desirable since for a large range of coolant flow rates, the overall heat transfer coefficient is insensitive to the flow rate, thus, flow rate cannot be used to control heat transfer in this regime. On the other hand, the heat added is very sensitive to the current supplied to the heater, thus, one can accurately control the heat added through the heater elements. Cooling Elements The cooling element is a typically a cooling channel or channels as shown in FIGS. 2a-c. In preferred embodiments, the pedestal is constructed by pouring molten aluminum around the cooling coil. Thus, the cooling channel should be made of a metal that has a higher melting point than aluminum. Metals such as stainless steel, nickel, and high-nickel alloys such as Inconel and Hastelloy may be used. As shown in FIG. 2b, the cooling channels are typically arranged in a continuous spiral for embodiments wherein the heat transfer assembly is used in a pedestal. However, one of skill in the art would understand how to modify this design for different applications. Alternate embodiments include a zig-zag design such as that shown in cooling channels 203 in FIG. 2d.

As discussed above, the cooling channels remove excess heat from the external source. A small amount of heat from the external source may be removed by other mechanisms, for example in a UV cure chamber, by convective loss to the chamber walls. The channels must be capable of removing any excess heat incident on the wafer from external sources so that its temperature does not exceed the set-point temperature.

According to various embodiments, the cooling elements of the present invention are capable of removing up to 10 kW of heat. For UV cure chamber applications, the cooling elements may be required to remove a range of heat flux. For example, if there is a plasma discharge in the chamber, the heat incident on the wafer may be as low as 100 W to 500 W. At the other end of the range, as with the case of UV lamps, as much as 10 kW of heat may be incident on the workpiece. The cooling elements are capable of removing a range of heat flux while the wafer temperature is maintained. In some embodiments, the heat flux may range from 100 W to 10 kW. In preferred embodiments, the heat flux ranges from 2 kW to 8 kW, and more preferably from 2 kW to 5 kW. In even more preferred embodiments, the heat flux ranges from 3 kW to 4 kW.

The heat transfer assemblies of the present invention are designed to use with low boiling coolants. Any low-boiling cooling fluid may be used, however water is particularly preferred. Other low-boiling coolants may include glycols, and engineered heat transfer fluids such as Galden and Fluorinert. In a particularly preferred embodiment, facility water is used as the coolant and is returned to the facility after use. Most semiconductor fabrication facilities have equipment cooling water loops to provide a readily available source of coolant. Depending upon the facility, the inlet water temperature may range from 10° C. to 25° C. In preferred embodiments, the inlet temperature is about 20° C. As discussed above, the outlet temperature should be below the boiling temperature. In preferred embodiments, the maximum outlet temperature is less than or equal to about 90° C. In more preferred embodiments, the maximum outlet temperature should be from about 50° C. to 80° C. In a particularly preferred embodiment, the exit temperature is about 60° C.

The flow rate of the water or other low boiling coolant will depend upon the particular application. For applications involving a semiconductor wafer on a pedestal, the flow rate should be at least 0.2 gallons per minute. Above this flow rate, the rate of cooling has been found to be independent of the flow rate. Flow rates ranging from 0.2 gallons per minute to 2 gallons per minute are preferred. Of course, one of skill in the art will understand that the optimal flow rate depends upon the design and construction particular process conditions as well as the application.

Heat Resistant Layer

The heat resistant layer has a heat transfer resistance calibrated as required by the heat flux from the lamps and the desired operating temperature. For example, a design may require that the heat transfer assembly be capable of removing from 3 kW to 4 kW from the wafer while maintaining the pedestal at a range of operating temperatures, e.g. 300° C. to 400° C. As discussed above, the resistance may be limited by two requirements: 1) the workpiece or pedestal temperature must not exceed the set-point temperature, and 2) the water or other low boiling coolant temperature must stay below boiling.

According to various embodiments, the heat resistant layer surrounds the cooling channels. In preferred embodiments, the heat resistant layer surrounds the cooling channel tube and is enclosed by an outer tube, as shown in FIG. 2a. The outer tube is coaxial with the cooling channel. Typically it is also coextensive with the spiraled portion of the cooling channel. The heat resistant layer is located in the annular gap between the cooling channel and the outer tube. In another embodiment, shown in FIG. 2c, the heat resistant layer is above the cooling channel and below the heating elements.

According to various embodiments, the heat resistant layer may comprise a spiral coil, a heat resistant material such as sand, a compressed gas or any combination of these. In a preferred embodiment, the heat resistant layer surrounds the cooling channel and is enclosed by an outer tube as described above. The resistance across the annular space between the tubes should dominate the heat transfer from the pedestal material to the coolant. In this embodiment, the layer preferably comprises a spiral coil of a defined pitch. In preferred embodiments, the tubes and the wire coil are made from materials having a higher melting point than that of aluminum so that the pedestal may be constructed by pouring molten aluminum over the already-fabricated tube-in-tube heat exchanger. Appropriate materials include stainless steel, nickel and titanium.

Figure 3:
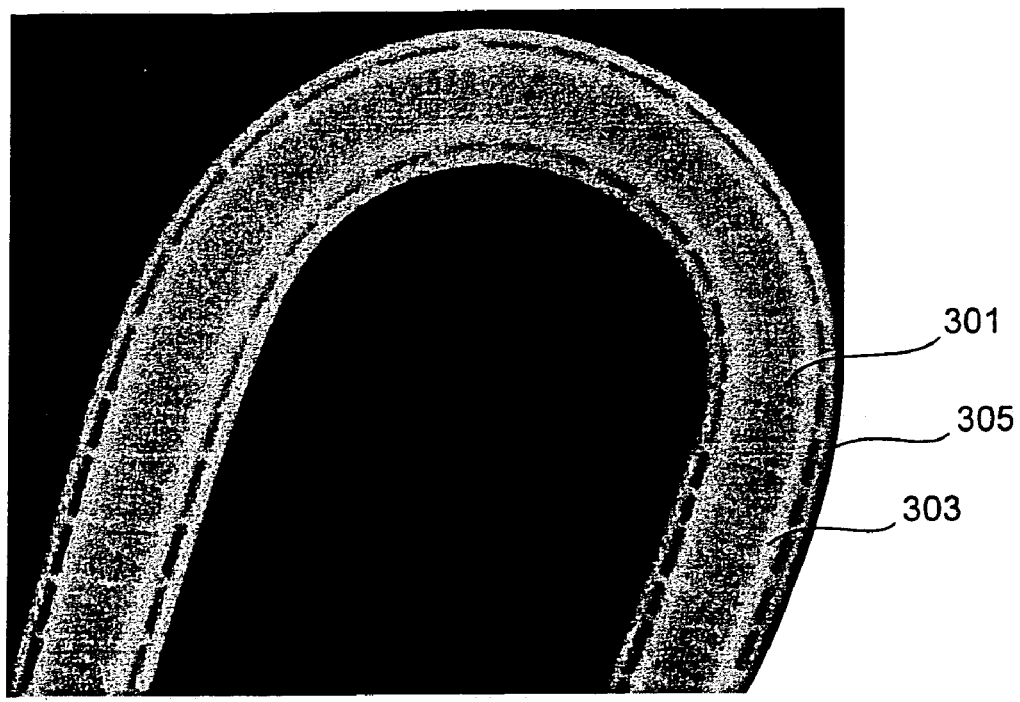
FIG. 3 is an X-ray image of tube-in-tube heat exchanger according to one embodiment of the present invention.

The tube-in-tube heat exchanger may be of any appropriate dimensions. For wafer pedestal applications, the following dimensions are preferred: for the inner tube (i.e., the cooling channel), an inner diameter (ID) ranging from 0.06 inches to 1 inch and an outer diameter (OD) ranging from 0.1 inches to 1.5 inches; for the outer tube, an ID ranging from 0.125 inches to 1.75 inches and an OD ranging from 0.188 inches to 2 inches. However, one of skill in the art will understand that the dimensions may be adjusted for the particular application. In a preferred embodiment, the diameter of the wire is equal to the annular gap distance, i.e. the ID of the outer tube minus the OD of the inner tube. One function of the wire coil (in addition to providing heat resistance) is to maintain the gap between the tubes. The wire coil maintains the gap even as the heat exchanger coils are bent to create the heat transfer assembly. FIG. 3 shows an x-ray of a coaxial tube-in-tube assembly with spiral wrapped wire according to one embodiment of the invention. Wire 301 is located between inner tube 303 and outer tube 305. As can be seen in FIG. 3, the uniform gap between tubes is maintained after being bent. In constructing the tube-in-tube assembly, it may be desirable to swage the outer tube over the inner tube. This will reduce the OD of the outer tube by a small amount on the order of a few milli-inches. Swaging the outer tube over the inner tube helps ensure performance repeatability from pedestal to pedestal.

The heat resistance of the layer may be calibrated by precisely setting the pitch and the annular gap distance (the ID of the outer tube minus OD of the inner tube). The pitch is the distance between loops of the spiral. Larger pitches result in less resistance. The desired amount of heat resistance may be achieved by properly setting the pitch. If the outer tube is swaged over the inner tube, the higher contact resistance caused by better contact between the tube surfaces and the spacing wire should be taken into account when calculating the required pitch and/or annular distance for a desired resistance.

Heat resistance may also be provided by material of a known resistance such as sand, ceramic beads or fiberglass. These materials may be used instead of or in addition to the spiral coil described above. Typically the heat resistance of the heat resistant layers described above (i.e., containing a spiral coil and air, a spiral coil and a material of known resistance, or material of known resistance and no coil) is fixed in the design. In alternate embodiments, resistance materials may include a compressed gas used alone or in addition to a spiral coil. Variable resistance may be achieved by varying the composition and/or the pressure of the gas. Alternatively, a high-boiling liquid (such as Syltherm and Dowtherm) may be filled into the annular gap between the two tubes and sealed in place.

In some embodiments, the heat resistant layer may comprise a layer of material having a known heat resistance. For example, in the embodiment pictured in FIG. 2c, heat resistant layer may comprise a metal having a lower conductivity than aluminum, such as stainless steel. The material may contain open areas or pores to further retard heat transfer. The desired heat resistance would be obtained by setting the number of pores or the volume of the open space. Compressed gas or other material may be included in the pores to calibrate the heat resistance.

The heat resistant layer must be able to sustain a high temperature gradient so that the coolant does not boil or over-cool the workpiece. Depending on the desired temperature of the wafer or other object, the temperature gradient across the layer may be around 580° C. (e.g. a 600° C. wafer and 20° C. water). According to various embodiments, the heat resistant layer must be capable of having a temperature gradient of around 600° C., 500° C., 4000, 300° C., 200° or 100° C.

According to various embodiments the resistivity of the heat resistant layer may range from 0.01 to 10° C./W$^{-1}$. The resistance of the heat resistant layer dominates so the rate of heat transfer is primarily driven by the heat resistant layer and is relatively insensitive to the conductive heat transfer through the tube walls and the convective heat transfer of the coolant.

Operating Ranges

The operating range of a heat transfer assembly of the present invention is the temperature range in which the workpiece or pedestal can be modulated solely by adjusting the heating element power. For example, a heat transfer assembly in a pedestal may have an operating range of 300° C.-400° C. The heat transfer assembly is able to maintain the pedestal at any temperature in this range without boiling the coolant, overcooling or going above the set-point temperature.

The operating range for a particular range of heat flux is primarily determined by the heater capacity and the resistance of the heat resistant layer. For heat transfer assemblies in which the heating capacity and the resistance are fixed, the operating range for a particular range of heat flux is also fixed. Variable operating capacity may be achieved with variable heat layer resistance as discussed above. Heating capacities of 4 kW have been found to allow operating ranges of about 100° C. (pedestal temperature) with fixed resistance systems. Operating range may be increased by increasing the heater capacity.

According to various embodiments, multiple heat transfer assemblies having different operating ranges may be used. For example, a pedestal may contain two tube-in-tube heat exchangers, each having a different pitch and resistance and operating range (e.g. a 200° C.-300° C. range and a 300'-400° C. range). Water would be selectively run through the appropriate tube during operation.

EXPERIMENTAL

Example 1

A tube-in-tube heat exchanger was constructed. The tubes were made of stainless steel. The annular gap contained spiral coil also made of stainless steel and air. The pitch of the coil was 0.06 inches. The outer tube had an OD of 0.375 inches and an ID of 0.305 inches. The inner tube had an OD of 0.25 inches and an ID of 0.19 inches. Molten aluminum was poured over the tube-in-tube exchanger and standard resistive heating elements to fabricate a pedestal in one casting. Heating capacity of the heating elements was 8 kW. The heating assembly had fixed operating range of 200° C.-300° C. in the presence of UV lamps that caused 4 kW of incident heat flux on the wafer.

A wafer was placed on the pedestal and exposed to a high-intensity broadband UV light source. The wafer was exposed to IR heat from 2 kW to 4 kW. Water of inlet temperature 20° C. and exit temperature 50° C. was used as a coolant. Set-point temperatures between 200° C.-300° C. were maintained (within 2° C.).

Example 2

A tube-in-tube heat exchanger was constructed. The tubes were made of stainless steel. The annular gap contained spiral coil also made of stainless steel and air. The pitch of the coil was 0.13 inches. The outer tube had an OD of 0.375 inches and an ID of 0.305 inches. The inner tube had an OD of 0.25 inches and an ID of 0.19 inches. Molten aluminum was poured over the tube-in-tube exchanger and standard resistive heating elements to fabricate a pedestal in one casting. Heating capacity of the heating elements was 8 kW. The heating assembly had fixed operating range of 300° C.-400° C. in the presence of UV lamps that caused up to 4 kW of incident heat flux on the wafer.

A wafer was placed on the pedestal and exposed to a high intensity broadband UV light source. The wafer was exposed to IR heat from 2 kW to 4 kW. Water of inlet temperature 20° C. and exit temperature 50° C. was used as a coolant. Set-point temperatures between 300° C.-400° C. were maintained (within 2° C.).

Although the foregoing invention has been described in some detail for purposes of clarity of understanding, it will be apparent that certain changes and modifications may be practiced within the scope of the appended claims. It should be noted that there are many alternative ways of implementing the present invention. Accordingly, the present embodiments are to be considered as illustrative and not restrictive, and the invention is not to be limited to the details given herein, but may be modified within the scope and equivalents of the appended claims.

What is claimed is:

1. A pedestal for maintaining a workpiece exposed to an external heat source at a uniform temperature comprising a heat transfer assembly, said heat transfer assembly comprising:
    a) a heating element for controlling the workpiece temperature;
    b) a cooling element for removing heat generated by the heat source, said cooling element using a coolant having a boiling temperature of less than 200° C. as a heat-transfer fluid; and
    c) a heat resistant layer located between the heating and cooling elements; said layer having a calibrated heat resistance such that coolant in the cooling element does not boil and the workpiece temperature is maintained.

2. The pedestal of claim 1, further comprising coaxial inner and outer tubes; the cooling channel comprising the inner tube; and the heat resistant layer comprising an annular space between the tubes.

3. The pedestal of claim 2, further comprising a spiral coil having a defined pitch between 0.01 and 10 inches and located in the annular gap.

4. The pedestal of claim 2, wherein the pedestal housing comprises aluminum and the coaxial tubes and heating elements are cast in the housing.

5. The pedestal of claim 1, wherein the heat resistant layer is located above a layer containing the cooling elements and below a layer containing the heating elements.

6. The pedestal of claim 1, wherein the external source is a UV lamp.

7. The pedestal of claim 1, wherein the uniform temperature is between 250 and 600° C.

8. The pedestal of claim 1, wherein the uniform temperature is between 250 and 450° C.

9. The pedestal of claim 1, wherein at least 3 kW of heat from the external source is incident on the workpiece.

10. The pedestal of claim 1, wherein the resistance of the heat resistant layer is variable.

11. The pedestal of claim 1, wherein the coolant is water.

12. A heat transfer assembly for maintaining a workpiece exposed to an external heat source at a uniform temperature of at least 200° C. comprising:
   a) a heating element for controlling the workpiece temperature;
   b) a cooling element for removing heat generated by the heat source, said cooling element using a coolant having a boiling temperature of less than 200° C. as a heat-transfer fluid; and
   c) a heat resistant layer located between the heating and cooling elements; said layer having a calibrated heat resistance such that coolant in the cooling element does not boil and the workpiece temperature is maintained.

13. The heat transfer assembly of claim 12, further comprising coaxial inner and outer tubes; the cooling element comprising the inner tube; and the heat resistant layer comprising an annular space between the tubes.

14. The heat transfer assembly of claim 12, wherein the temperate gradient across the heat resistant layer is at least 100° C.

15. The heat transfer assembly of claim 12, wherein the heat resistant layer further comprises a spiral coil in the annular space.

16. The heat transfer assembly of claim 15, wherein the spiral coil is at a uniform pitch.

17. The heat transfer assembly of claim 16, wherein the pitch ranges from 0.01 inches to 10 inches.

18. The heat transfer assembly of claim 13, wherein the heat resistant layer further comprises a material selected from sand, ceramic beads or fiberglass in the annular space.

19. The heat transfer assembly of claim 13, wherein the heat resistant layer further comprises a compressed gas or a high-boiling liquid in the annular space.

20. The heat transfer assembly of claim 12, wherein the resistance of the heat resistant layer is variable.

21. The pedestal of claim 1 wherein the calibrated heat resistance of the heat resistant layer is such that the temperature of the coolant is maintained below the coolant boiling temperature.

22. The heat transfer assembly of claim 12 wherein the calibrated heat resistance of the heat resistant layer is such that the temperature of the coolant is maintained below the coolant boiling temperature.

* * * * *